US008516187B2

(12) United States Patent
Chen et al.

(10) Patent No.: US 8,516,187 B2
(45) Date of Patent: Aug. 20, 2013

(54) DATA TRANSFER SCHEME FOR NON-VOLATILE MEMORY MODULE

(75) Inventors: Chi-She Chen, Walnut, CA (US); Jeffrey C. Solomon, Irvine, CA (US); Scott Milton, Irvine, CA (US); Jayesh Bhakta, Cerritos, CA (US)

(73) Assignee: Netlist, Inc., Irvine, CA (US)

( * ) Notice: Subject to any disclaimer, the term of this patent is extended or adjusted under 35 U.S.C. 154(b) by 0 days.

(21) Appl. No.: 13/536,173

(22) Filed: Jun. 28, 2012

(65) Prior Publication Data

US 2012/0271990 A1 Oct. 25, 2012

Related U.S. Application Data

(60) Division of application No. 12/240,916, filed on Sep. 29, 2008, now Pat. No. 8,301,833, which is a continuation of application No. 12/131,873, filed on Jun. 2, 2008, now abandoned.

(60) Provisional application No. 60/941,586, filed on Jun. 1, 2007.

(51) Int. Cl.
*G06F 12/00* (2006.01)
*G06F 13/00* (2006.01)

(52) U.S. Cl.
USPC ........... 711/104; 711/160; 711/161; 711/162; 711/170; 711/171; 711/172; 711/212; 710/10

(58) Field of Classification Search
USPC ................. 711/160, 161, 162, 104, 170, 171, 711/172, 212; 710/10
See application file for complete search history.

(56) References Cited

U.S. PATENT DOCUMENTS

| 4,420,821 | A | 12/1983 | Hoffman |
| 4,449,205 | A | 5/1984 | Hoffman |
| 5,519,663 | A | 5/1996 | Harper, Jr. et al. |
| 5,675,725 | A * | 10/1997 | Malcolm ..................... 714/6.12 |
| 6,158,015 | A | 12/2000 | Klein |
| 6,336,174 | B1 | 1/2002 | Li et al. |
| 6,336,176 | B1 | 1/2002 | Leyda et al. |
| 6,487,623 | B1 | 11/2002 | Emerson et al. |
| 6,658,507 | B1 | 12/2003 | Chan |
| 6,799,244 | B2 | 9/2004 | Tanaka et al. |

(Continued)

OTHER PUBLICATIONS

International Search Report and Written Opinion in PCT/US12/48750, dated Oct. 10, 2012.

(Continued)

*Primary Examiner* — Midys Rojas
(74) *Attorney, Agent, or Firm* — Nixon Peabody LLP; Khaled Shami

(57) ABSTRACT

Certain embodiments described herein include a memory system which can communicate with a host system such as a disk controller of a computer system. The memory system can include volatile and non-volatile memory and a controller which are configured such that the controller backs up the volatile memory using the non-volatile memory in the event of a trigger condition. In order to power the system in the event of a power failure or reduction, the memory system can include a secondary power source which is not a battery and may include, for example, a capacitor or capacitor array. The memory system can be configured such that the operation of the volatile memory is not adversely affected by the non-volatile memory or the controller when the volatile memory is interacting with the host system.

32 Claims, 12 Drawing Sheets

(56) References Cited

U.S. PATENT DOCUMENTS

| | | | |
|---|---|---|---|
| 7,111,142 B2 * | 9/2006 | Spencer et al. | 711/170 |
| 7,409,590 B2 | 8/2008 | Moshayedi et al. | |
| 8,301,833 B1 | 10/2012 | Chen et al. | |
| 2002/0083368 A1 | 6/2002 | Abe et al. | |
| 2004/0190210 A1 | 9/2004 | Leete | |
| 2007/0192627 A1 | 8/2007 | Oshikiri | |
| 2008/0104344 A1 | 5/2008 | Shimozono et al. | |
| 2008/0195806 A1 | 8/2008 | Cope | |
| 2010/0274953 A1 | 10/2010 | Lee et al. | |

OTHER PUBLICATIONS

Office Action in U.S. Appl. No. 12/240,916, mailed Apr. 3, 2012.
Office Action in U.S. Appl. No. 12/240,916, mailed Feb. 1, 2012.
Office Action in U.S. Appl. No. 12/240,916, mailed Jul. 29, 2011.

* cited by examiner

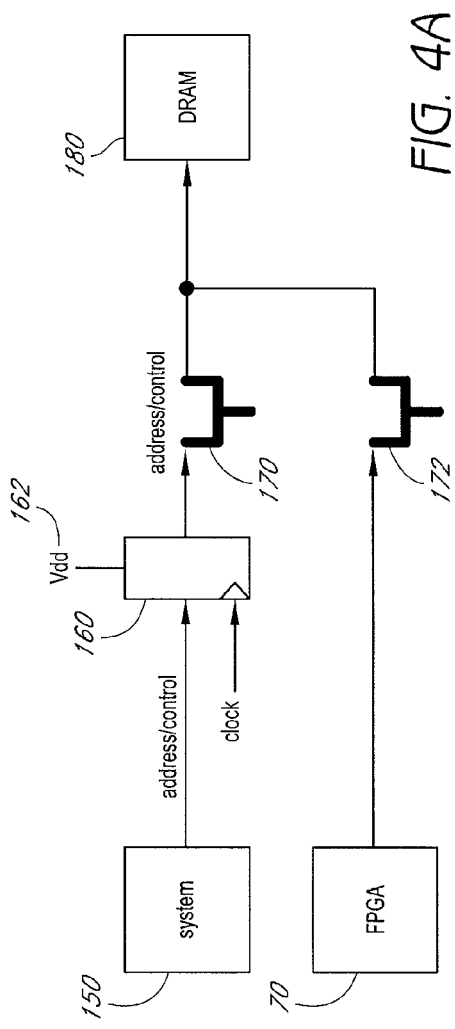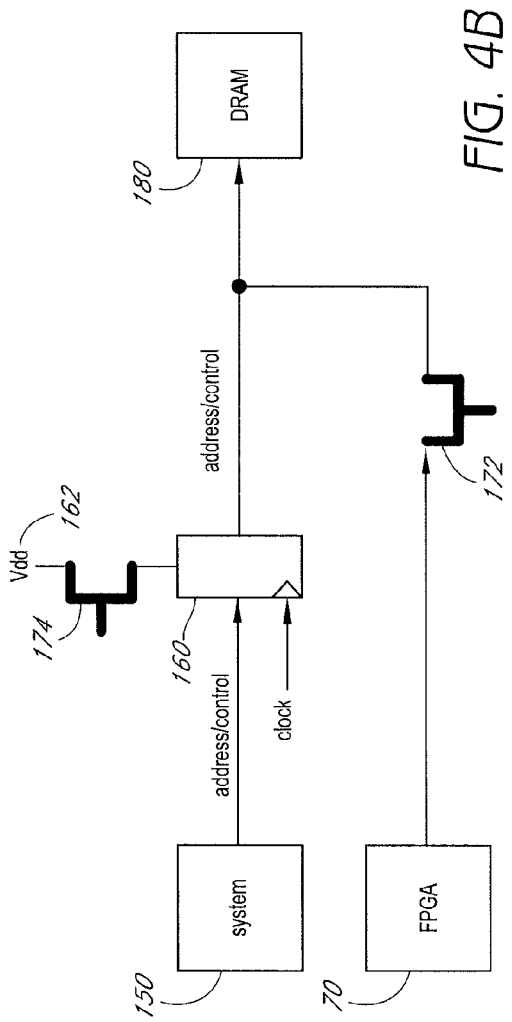

DATA TRANSFER SCHEME FOR NON-VOLATILE MEMORY MODULE

CROSS-REFERENCE TO RELATED APPLICATIONS

This application is a divisional of U.S. patent application Ser. No. 12/240,916, titled "Non-Volatile Memory Module," filed Sep. 29, 2008, which is a continuation of U.S. patent application Ser. No. 12/131,873, filed Jun. 2, 2008, which claims the benefit of U.S. Provisional Application No. 60/941,586, filed Jun. 1, 2007, the contents of which are incorporated by reference herein in their entirety.

BACKGROUND

Certain types of memory modules comprise a plurality of dynamic random-access memory (DRAM) devices mounted on a printed circuit board (PCB). These memory modules are typically mounted in a memory slot or socket of a computer system (e.g., a server system or a personal computer) and are accessed by the computer system to provide volatile memory to the computer system.

Volatile memory generally maintains stored information only when it is powered. Batteries have been used to provide power to volatile memory during power failures or interruptions. However, batteries may require maintenance, may need to be replaced, are not environmentally friendly, and the status of batteries can be difficult to monitor.

Non-volatile memory can generally maintain stored information while power is not applied to the non-volatile memory. In certain circumstances, it can therefore be useful to backup volatile memory using non-volatile memory.

SUMMARY

Disclosed herein is a method for transferring one or more data words from a volatile memory subsystem to a non-volatile memory subsystem, each of the one or more data words having a plurality of data word portions including a first data word portion and a second data word portion. The method includes, in a first mode of operation, communicating data words between the volatile memory subsystem and a host system. The method also includes, in a second mode of operation: transferring one or more first data word portions from the volatile memory subsystem into a buffer; transferring one or more second data word portions from the volatile memory subsystem into the buffer; and transferring data words from the buffer into the non-volatile memory subsystem an entire data word at a time or multiple data words in their entirety at a time.

Also disclosed herein is a method for transferring one or more data words from a volatile memory subsystem to a non-volatile memory subsystem, each of the one or more data words having a plurality of data word portions including a first data word portion and a second data word portion. The method includes: transferring one or more first data word portions from the volatile memory subsystem into a buffer; transferring one or more second data word portions from the volatile memory subsystem into the buffer; and transferring data words from the buffer into the non-volatile memory subsystem an entire data word at a time or multiple data words in their entirety at a time.

Also disclosed herein is a memory system that includes a volatile memory subsystem having at least first and second segments operable to store one or more data words such that a first portion of each data word is stored in the first segment and a second portion of each data word is stored in the second segment. The memory system also includes a non-volatile memory subsystem, a buffer, and controller that is operable to, in a first mode of operation of the memory system, communicate data words between the volatile memory subsystem and a host system, and, in a second mode of operation of the memory system: transfer one or more first portions of data words from the first segment into the buffer; transfer one or more second portions of data words from the second segment into the buffer; and transfer data words from the buffer into the non-volatile memory subsystem an entire data word at a time or multiple data words in their entirety at a time.

Also disclosed herein is a memory system that includes a volatile memory subsystem having at least first and second segments operable to store one or more data words such that a first portion of each data word is stored in the first segment and a second portion of each data word is stored in the second segment. The memory system also includes a non-volatile memory subsystem, a buffer, and a controller operable to: transfer one or more first portions of data words from the first segment into the buffer; transfer one or more second portions of data words from the second segment into the buffer; and transfer data words from the buffer into the non-volatile memory subsystem an entire data word at a time or multiple data words in their entirety at a time.

BRIEF DESCRIPTION OF THE DRAWINGS

FIGS. 4A-4C schematically illustrate example embodiments of memory systems having volatile memory subsystems comprising registered dual in-line memory modules in accordance with certain embodiments described herein.

DETAILED DESCRIPTION

Figure 1:
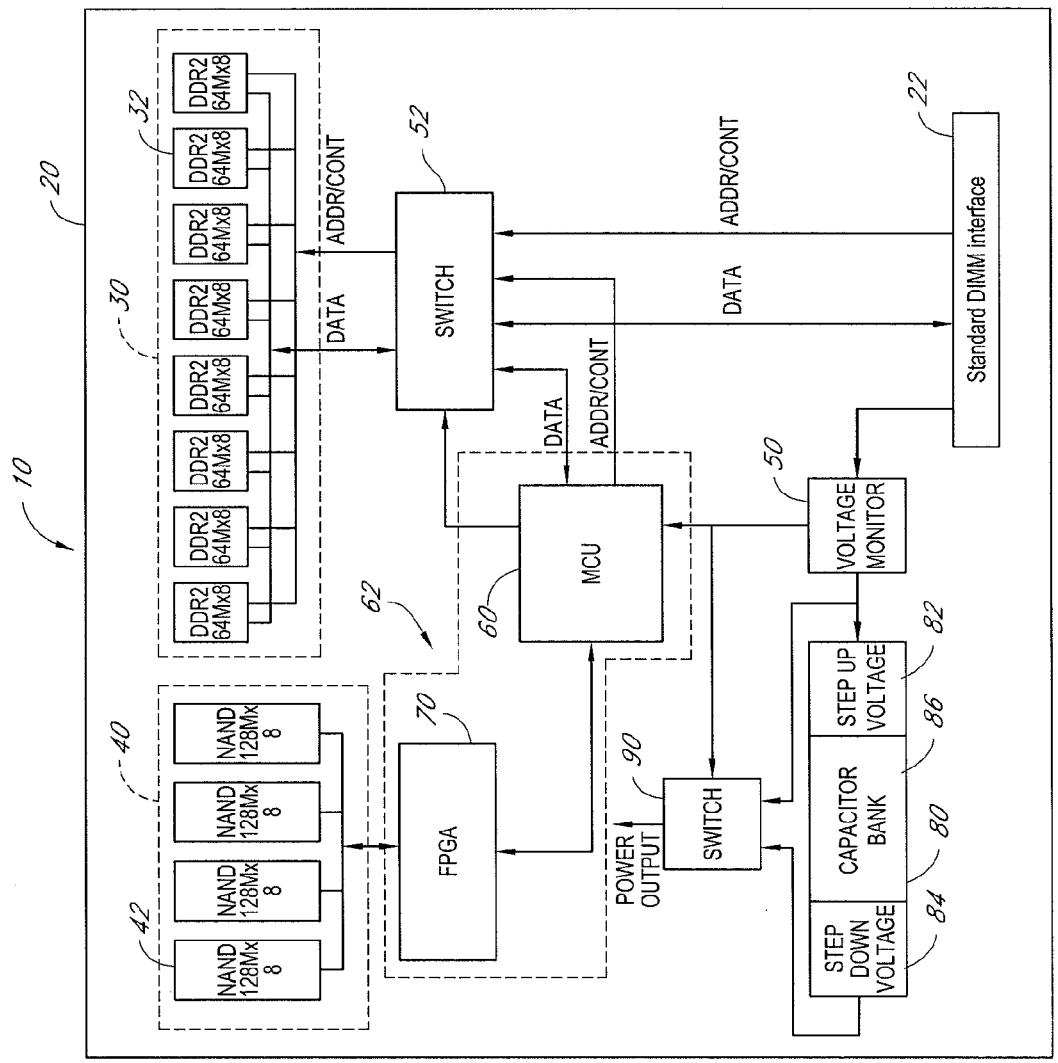
FIG. 1 is a block diagram of an example memory system compatible with certain embodiments described herein.

Certain embodiments described herein include a memory system which can communicate with a host system such as a disk controller of a computer system. The memory system can include volatile and non-volatile memory, and a controller. The controller backs up the volatile memory using the non-volatile memory in the event of a trigger condition. Trigger conditions can include, for example, a power failure, power reduction, request by the host system, etc. In order to power the system in the event of a power failure or reduction, the memory system can include a secondary power source which does not comprise a battery and may include, for example, a capacitor or capacitor array.

In certain embodiments, the memory system can be configured such that the operation of the volatile memory is not adversely affected by the non-volatile memory or by the controller when the volatile memory is interacting with the host system. For example, one or more isolation devices may isolate the non-volatile memory and the controller from the volatile memory when the volatile memory is interacting with the host system and may allow communication between the volatile memory and the non-volatile memory when the data of the volatile memory is being restored or backed-up. This configuration generally protects the operation of the volatile memory when isolated while providing backup and restore capability in the event of a trigger condition, such as a power failure.

In certain embodiments described herein, the memory system includes a power module which provides power to the various components of the memory system from different sources based on a state of the memory system in relation to a trigger condition (e.g., a power failure). The power module may switch the source of the power to the various components in order to efficiently provide power in the event of the power failure. For example, when no power failure is detected, the power module may provide power to certain components, such as the volatile memory, from system power while charging a secondary power source (e.g., a capacitor array). In the event of a power failure or other trigger condition, the power module may power the volatile memory elements using the previously charged secondary power source.

In certain embodiments, the power module transitions relatively smoothly from powering the volatile memory with system power to powering it with the secondary power source. For example, the power system may power volatile memory with a third power source from the time the memory system detects that power failure is likely to occur until the time the memory system detects that the power failure has actually occurred.

In certain embodiments, the volatile memory system can be operated at a reduced frequency during backup and/or restore operations which can improve the efficiency of the system and save power. In some embodiments, during backup and/or restore operations, the volatile memory communicates with the non-volatile memory by writing and/or reading data words in bit-wise slices instead of by writing entire words at once. In certain embodiments, when each slice is being written to or read from the volatile memory the unused slice(s) of volatile memory is not active, which can reduce the power consumption of the system.

In yet other embodiments, the non-volatile memory can include at least 100 percent more storage capacity than the volatile memory. This configuration can allow the memory system to efficiently handle subsequent trigger conditions.

FIG. 1 is a block diagram of an example memory system 10 compatible with certain embodiments described herein. The memory system 10 can be coupled to a host computer system and can include a volatile memory subsystem 30, a non-volatile memory subsystem 40, and a controller 62 operatively coupled to the non-volatile memory subsystem 40. In certain embodiments, the memory system 10 includes at least one circuit 52 configured to selectively operatively decouple the controller 62 from the volatile memory subsystem 30.

In certain embodiments, the memory system 10 comprises a memory module. The memory system 10 may comprise a printed-circuit board (PCB) 20. In certain embodiments, the memory system 10 has a memory capacity of 512-MB, 1-GB, 2-GB, 4-GB, or 8-GB. Other volatile memory capacities are also compatible with certain embodiments described herein. In certain embodiments, the memory system 10 has a non-volatile memory capacity of 512-MB, 1-GB, 2-GB, 4-GB, 8-GB, 16-GB, or 32-GB. Other non-volatile memory capacities are also compatible with certain embodiments described herein. In addition, memory systems 10 having widths of 4 bytes, 8 bytes, 16 bytes, 32 bytes, or 32 bits, 64 bits, 128 bits, 256 bits, as well as other widths (in bytes or in bits), are compatible with embodiments described herein. In certain embodiments, the PCB 20 has an industry-standard form factor. For example, the PCB 20 can have a low profile (LP) form factor with a height of 30 millimeters and a width of 133.35 millimeters. In certain other embodiments, the PCB 20 has a very high profile (VHP) form factor with a height of 50 millimeters or more. In certain other embodiments, the PCB 20 has a very low profile (VLP) form factor with a height of 18.3 millimeters. Other form factors including, but not limited to, small-outline (SO-DIMM), unbuffered (UDIMM), registered (RDIMM), fully-buffered (FBDIMM), miniDIMM, mini-RDIMM, VLP mini-DIMM, micro-DIMM, and SRAM DIMM are also compatible with certain embodiments described herein. For example, in other embodiments, certain non-DIMM form factors are possible such as, for example, single in-line memory module (SIMM), multi-media card (MMC), and small computer system interface (SCSI).

In certain preferred embodiments, the memory system 10 is in electrical communication with the host system. In other embodiments, the memory system 10 may communicate with a host system using some other type of communication, such as, for example, optical communication. Examples of host systems include, but are not limited to, blade servers, 1U servers, personal computers (PCs), and other applications in which space is constrained or limited. The memory system 10 can be in communication with a disk controller of a computer system, for example. The PCB 20 can comprise an interface 22 that is configured to be in electrical communication with the host system (not shown). For example, the interface 22 can comprise a plurality of edge connections which fit into a corresponding slot connector of the host system. The interface 22 of certain embodiments provides a conduit for power voltage as well as data, address, and control signals between the memory system 10 and the host system. For example, the interface 22 can comprise a standard 240-pin DDR2 edge connector.

The volatile memory subsystem 30 comprises a plurality of volatile memory elements 32 and the non-volatile memory subsystem 40 comprises a plurality of non-volatile memory elements 42. Certain embodiments described herein advantageously provide non-volatile storage via the non-volatile memory subsystem 40 in addition to high-performance (e.g., high speed) storage via the volatile memory subsystem 30. In certain embodiments, the first plurality of volatile memory elements 32 comprises two or more dynamic random-access memory (DRAM) elements. Types of DRAM elements 32 compatible with certain embodiments described herein include, but are not limited to, DDR, DDR2, DDR3, and synchronous DRAM (SDRAM). For example, in the block diagram of FIG. 1, the first memory bank 30 comprises eight 64M×8 DDR2 SDRAM elements 32. The volatile memory elements 32 may comprise other types of memory elements such as static random-access memory (SRAM). In addition, volatile memory elements 32 having bit widths of 4, 8, 16, 32, as well as other bit widths, are compatible with certain embodiments described herein. Volatile memory elements 32 compatible with certain embodiments described herein have packaging which include, but are not limited to, thin small-outline package (TSOP), ball-grid-array (BGA), fine-pitch BGA (FBGA), micro-BGA (1.1,BGA), mini-BGA (mBGA), and chip-scale packaging (CSP).

In certain embodiments, the second plurality of non-volatile memory elements 42 comprises one or more flash memory elements. Types of flash memory elements 42 compatible with certain embodiments described herein include, but are not limited to, NOR flash, NAND flash, ONE-NAND flash, and multi-level cell (MLC). For example, in the block diagram of FIG. 1, the second memory bank 40 comprises 512 MB of flash memory organized as four 128 Mb×8 NAND flash memory elements 42. In addition, nonvolatile memory elements 42 having bit widths of 4, 8, 16, 32, as well as other bit widths, are compatible with certain embodiments described herein. Non-volatile memory elements 42 compatible with certain embodiments described herein have packaging which include, but are not limited to, thin small-outline package (TSOP), ball-grid-array (BGA), fine-pitch BGA (FBGA), micro-BGA (PGA), mini-BGA (mBGA), and chip-scale packaging (CSP).

Figure 2:
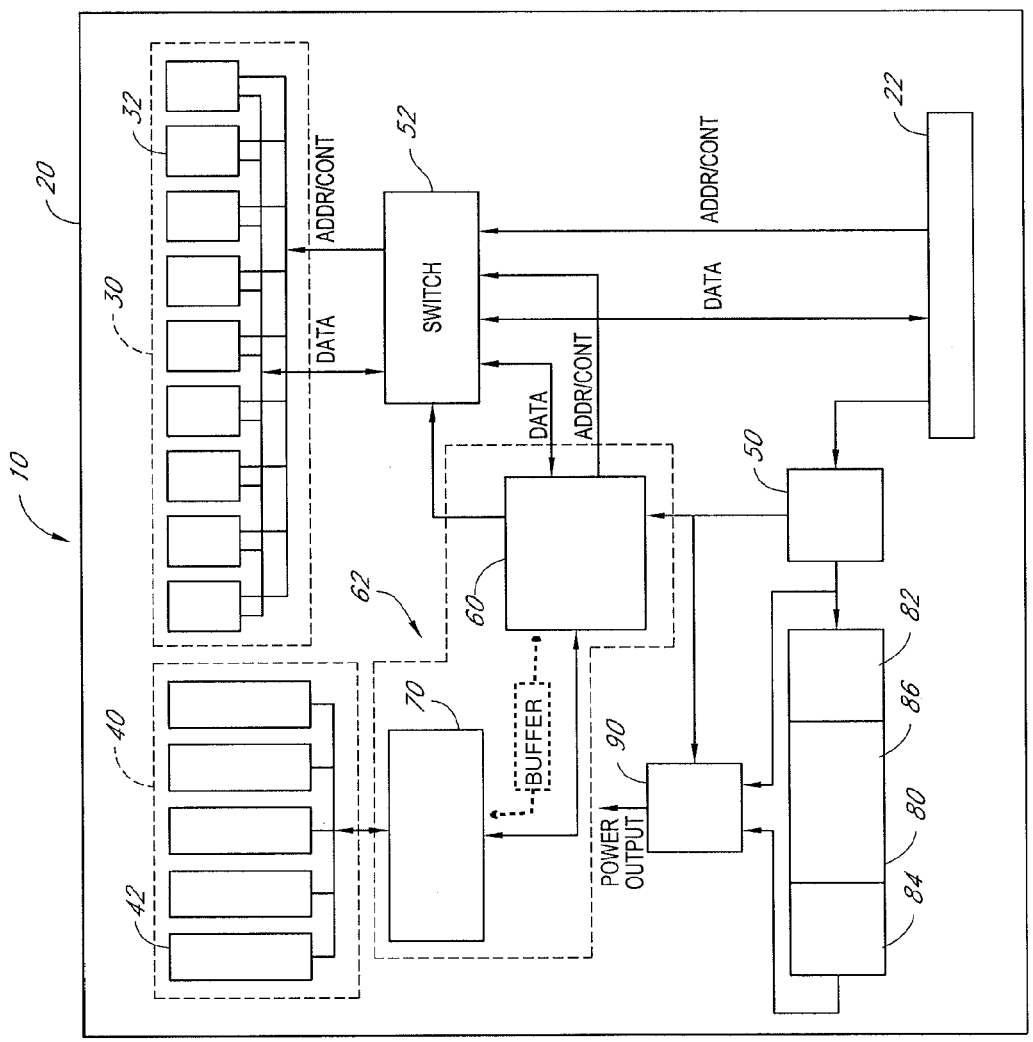
FIG. 2 is a block diagram of an example memory module with ECC (error-correcting code) having a volatile memory subsystem with nine volatile memory elements and a non-volatile memory subsystem with five non-volatile memory elements in accordance with certain embodiments described herein.

FIG. 2 is a block diagram of an example memory module 10 with ECC (error-correcting code) having a volatile memory subsystem 30 with nine volatile memory elements 32 and a non-volatile memory subsystem 40 with five non-volatile memory elements 42 in accordance with certain embodiments described herein. The additional memory element 32 of the first memory bank 30 and the additional memory element 42 of the second memory bank 40 provide the ECC capability. In certain other embodiments, the volatile memory subsystem 30 comprises other numbers of volatile memory elements 32 (e.g., 2, 3, 4, 5, 6, 7, more than 9). In certain embodiments, the non-volatile memory subsystem 40 comprises other numbers of non-volatile memory elements 42 (e.g., 2, 3, more than 5).

Figure 3:
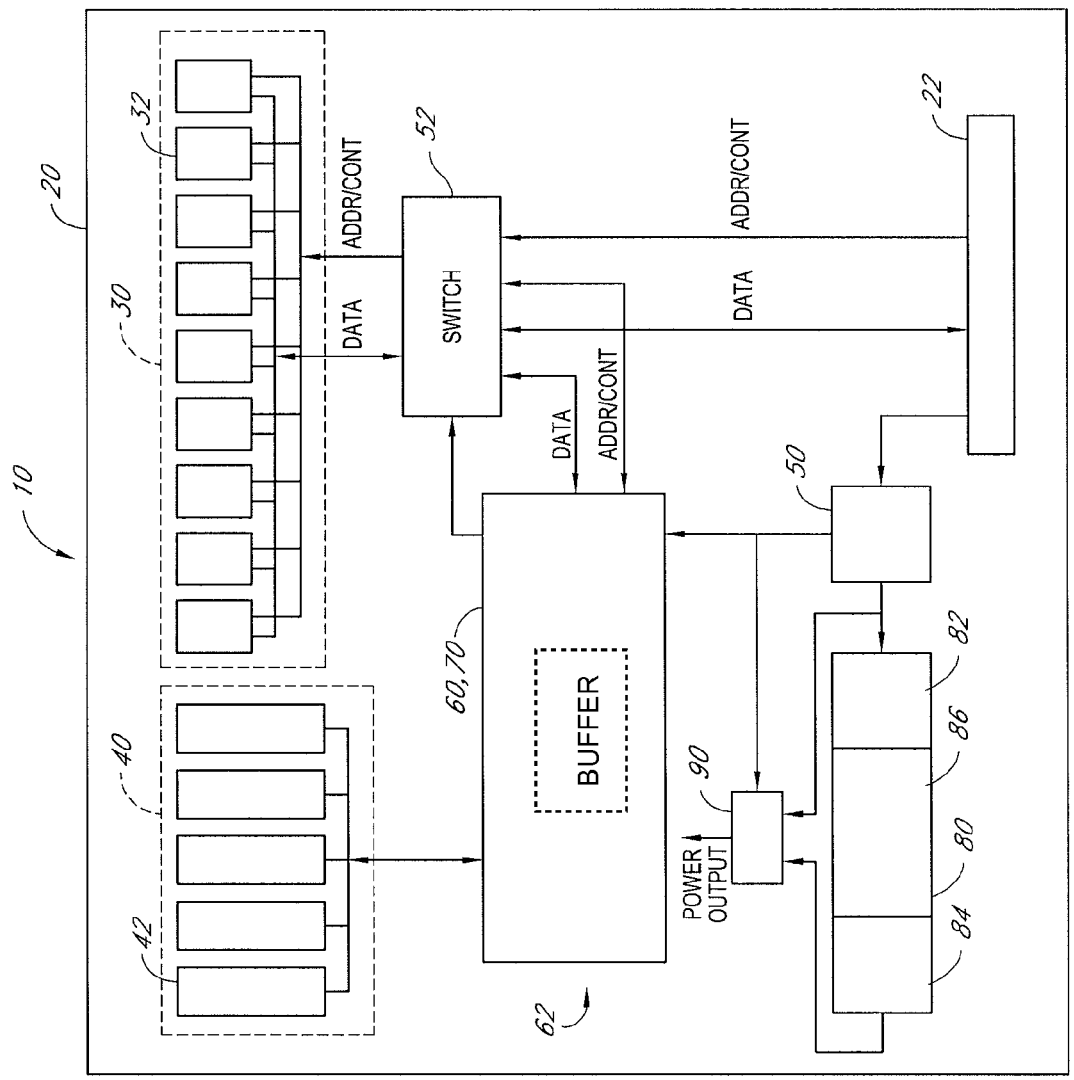
FIG. 3 is a block diagram of an example memory module having a microcontroller unit and logic element integrated into a single device in accordance with certain embodiments described herein.

Referring to FIG. 1, in certain embodiments, the logic element 70 comprises a field-programmable gate array (FPGA). In certain embodiments, the logic element 70 comprises an FPGA available from Lattice Semiconductor Corporation which includes an internal flash. In certain other embodiments, the logic element 70 comprises an FPGA available from another vendor. The internal flash can improve the speed of the memory system 10 and save physical space. Other types of logic elements 70 compatible with certain embodiments described herein include, but are not limited to, a programmable-logic device (PLD), an application-specific integrated circuit (ASIC), a custom-designed semiconductor device, a complex programmable logic device (CPLD). In certain embodiments, the logic element 70 is a custom device. In certain embodiments, the logic element 70 comprises various discrete electrical elements, while in certain other embodiments, the logic element 70 comprises one or more integrated circuits. FIG. 3 is a block diagram of an example memory module 10 having a microcontroller unit 60 and logic element 70 integrated into a single controller 62 in accordance with certain embodiments described herein. In certain embodiments, the controller 62 includes one or more other components. For example, in one embodiment, an FPGA without an internal flash is used and the controller 62 includes a separate flash memory component which stores configuration information to program the FPGA.

In certain embodiments, the at least one circuit 52 comprises one or more switches coupled to the volatile memory subsystem 30, to the controller 62, and to the host computer (e.g., via the interface 22, as schematically illustrated by FIGS. 1-3). The one or more switches are responsive to signals (e.g., from the controller 62) to selectively operatively decouple the controller 62 from the volatile memory subsystem 30 and to selectively operatively couple the controller 62 to the volatile memory subsystem 30. In addition, in certain embodiments, the at least one circuit 52 selectively operatively couples and decouples the volatile memory subsystem 30 and the host system.

Figure 4C:
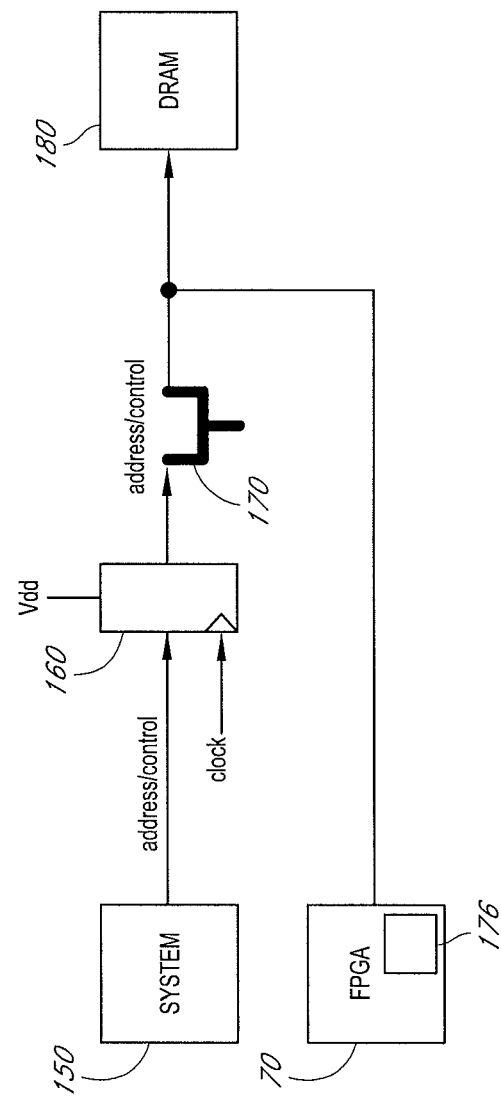

In certain embodiments, the volatile memory subsystem 30 can comprise a registered DIMM subsystem comprising one or more registers 160 and a plurality of DRAM elements 180, as schematically illustrated by FIG. 4A. In certain such embodiments, the at least one circuit 52 can comprise one or more switches 172 coupled to the controller 62 (e.g., logic element 70) and to the volatile memory subsystem 30 which can be actuated to couple and decouple the controller 62 to and from the volatile memory subsystem 30, respectively. The memory system 10 further comprises one or more switches 170 coupled to the one or more registers 160 and to the plurality of DRAM elements 180 as schematically illustrated by FIG. 4A. The one or more switches 170 can be selectively switched, thereby selectively operatively coupling the volatile memory subsystem 30 to the host system 150. In certain other embodiments, as schematically illustrated by FIG. 4B, the one or more switches 174 are also coupled to the one or more registers 160 and to a power source 162 for the one or more registers 160. The one or more switches 174 can be selectively switched to turn power on or off to the one or more registers 160, thereby selectively operatively coupling the volatile memory subsystem 30 to the host system 150. As schematically illustrated by FIG. 4C, in certain embodiments the at least one circuit 52 comprises a dynamic on-die termination (ODT) 176 circuit of the logic element 70. For example, the logic element 70 can comprise a dynamic ODT circuit 176 which selectively operatively couples and decouples the logic element 70 to and from the volatile memory subsystem 30, respectively. In addition, and similar to the example embodiment of FIG. 4A described above, the one or more switches 170 can be selectively switched, thereby selectively operatively coupling the volatile memory subsystem 30 to the host system 150.

Certain embodiments described herein utilize the non-volatile memory subsystem 40 as a flash "mirror" to provide backup of the volatile memory subsystem 30 in the event of certain system conditions. For example, the non-volatile memory subsystem 40 may backup the volatile memory subsystem 30 in the event of a trigger condition, such as, for example, a power failure or power reduction or a request from the host system. In one embodiment, the non-volatile memory subsystem 40 holds intermediate data results in a noisy system environment when the host computer system is engaged in a long computation. In certain embodiments, a backup may be performed on a regular basis. For example, in one embodiment, the backup may occur every millisecond in response to a trigger condition. In certain embodiments, the trigger condition occurs when the memory system 10 detects that the system voltage is below a certain threshold voltage. For example, in one embodiment, the threshold voltage is 10 percent below a specified operating voltage. In certain embodiments, a trigger condition occurs when the voltage goes above a certain threshold value, such as, for example, 10 percent above a specified operating voltage. In some embodiments, a trigger condition occurs when the voltage goes below a threshold or above another threshold. In various embodiments, a backup and/or restore operation may occur in reboot and/or non-reboot trigger conditions.

As schematically illustrated by FIGS. 1 and 2, in certain embodiments, the controller 62 may comprise a microcontroller unit (MCU) 60 and a logic element 70. In certain embodiments, the MCU 60 provides memory management for the non-volatile memory subsystem 40 and controls data transfer between the volatile memory subsystem 30 and the non-volatile memory subsystem 40. The MCU 60 of certain embodiments comprises a 16-bit microcontroller, although other types of microcontrollers are also compatible with certain embodiments described herein. As schematically illustrated by FIGS. 1 and 2, the logic element 70 of certain embodiments is in electrical communication with the non-volatile memory subsystem 40 and the MCU 60. The logic element 70 can provide signal level translation between the volatile memory elements 32 (e.g., 1.8V SSTL-2 for DDR2 SDRAM elements) and the non-volatile memory elements 42 (e.g., 3V TTL for NAND flash memory elements). In certain embodiments, the logic element 70 is also programmed to perform address/address translation between the volatile memory subsystem 30 and the non-volatile memory subsystem 40. In certain preferred embodiments, 1-NAND type flash are used for the non-volatile memory elements 42 because of their superior read speed and compact structure.

The memory system 10 of certain embodiments is configured to be operated in at least two states. The at least two states can comprise a first state in which the controller 62 and the non-volatile memory subsystem 40 are operatively decoupled (e.g., isolated) from the volatile memory subsystem 30 by the at least one circuit 52 and a second state in which the volatile memory subsystem 30 is operatively coupled to the controller 62 to allow data to be communicated between the volatile memory subsystem 30 and the nonvolatile memory subsystem 40 via the controller 62. The memory system 10 may transition from the first state to the second state in response to a trigger condition, such as when the memory system 10 detects that there is a power interruption (e.g., power failure or reduction) or a system hang-up.

The memory system 10 may further comprise a voltage monitor 50. The voltage monitor circuit 50 monitors the voltage supplied by the host system via the interface 22. Upon detecting a low voltage condition (e.g., due to a power interruption to the host system), the voltage monitor circuit 50 may transmit a signal to the controller 62 indicative of the detected condition. The controller 62 of certain embodiments responds to the signal from the voltage monitor circuit 50 by transmitting a signal to the at least one circuit 52 to operatively couple the controller to the volatile memory system 30, such that the memory system 10 enters the second state. For example, the voltage monitor 50 may send a signal to the MCU 60 which responds by accessing the data on the volatile memory system 30 and by executing a write cycle on the non-volatile memory subsystem 40. During this write cycle, data is read from the volatile memory subsystem 30 and is transferred to the non-volatile memory subsystem 40 via the MCU 60. In certain embodiments, the voltage monitor circuit 50 is part of the controller 62 (e.g., part of the MCU 60) and the voltage monitor circuit 50 transmits a signal to the other portions of the controller 62 upon detecting a power threshold condition.

The isolation or operational decoupling of the volatile memory subsystem 30 from the non-volatile memory subsystem in the first state can preserve the integrity of the operation of the memory system 10 during periods of operation in which signals (e.g., data) are transmitted between the host system and the volatile memory subsystem 30. For example, in one embodiment during such periods of operation, the controller 62 and the nonvolatile memory subsystem 40 do not add a significant capacitive load to the volatile memory system 30 when the memory system 10 is in the first state. In certain such embodiments, the capacitive load of the controller 62 and the non-volatile memory subsystem 40 do not significantly affect the signals propagating between the volatile memory subsystem 30 and the host system. This can be particularly advantageous in relatively high-speed memory systems where loading effects can be significant. In one preferred embodiment, the at least one circuit 52 comprises an FSA1208 Low-Power, Eight-Port, Hi-Speed Isolation Switch from Fairchild Semiconductor. In other embodiments, the at least one circuit 52 comprises other types of isolation devices.

Power may be supplied to the volatile memory subsystem 30 from a first power supply (e.g., a system power supply) when the memory system 10 is in the first state and from a second power supply 80 when the memory system 10 is in the second state. In certain embodiments, the memory system 10 is in the first state when no trigger condition (e.g., a power failure) is present and the memory system 10 enters the second state in response to a trigger condition. In certain embodiments, the memory system 10 has a third state in which the controller 62 is operatively decoupled from the volatile memory subsystem 30 and power is supplied to the volatile memory subsystem 30 from a third power supply (not shown). For example, in one embodiment the third power supply may provide power to the volatile memory subsystem 30 when the memory system 10 detects that a trigger condition is likely to occur but has not yet occurred.

In certain embodiments, the second power supply 80 does not comprise a battery. Because a battery is not used, the second power supply 80 of certain embodiments may be relatively easy to maintain, does not generally need to be replaced, and is relatively environmentally friendly. In certain embodiments, as schematically illustrated by FIG. 13, the second power supply 80 comprises a step-up transformer 82, a step-down transformer 84, and a capacitor bank 86 comprising one or more capacitors (e.g., double-layer capacitors). In one example embodiment, capacitors may take about three to four minutes to charge and about two minutes to discharge. In other embodiments, the one or more capacitors may take a longer time or a shorter time to charge and/or discharge. For example, in certain embodiments, the second power supply 80 is configured to power the volatile memory subsystem 30 for less than thirty minutes. In certain embodiments, the second power supply 80 may comprise a battery. For example, in certain embodiments, the second power supply 80 comprises a battery and one or more capacitors and is configured to power the volatile memory subsystem 30 for no more than thirty minutes.

In certain embodiments, the capacitor bank 86 of the second power supply 80 is charged by the first power supply while the memory system 10 is in the first state. As a result, the second power supply 80 is fully charged when the memory system 10 enters the second state. The memory system 10 and the second power supply 80 may be located on the same printed circuit board 20. In other embodiments, the second power supply 80 may not be on the same printed circuit board 20 and may be tethered to the printed circuit board 20, for example.

When operating in the first state, in certain embodiments, the step-up transformer 82 keeps the capacitor bank 86 charged at a peak value. In certain embodiments, the step-down transformer 84 acts as a voltage regulator to ensure that regulated voltages are supplied to the memory elements (e.g., 1.8V to the volatile DRAM elements 32 and 3.0V to the non-volatile flash memory elements 42) when operating in the second state (e.g., during power down). In certain embodiments, as schematically illustrated by FIGS. 1-3, the memory module 10 further comprises a switch 90 (e.g., FET switch) that switches power provided to the controller 62, the volatile memory subsystem 30, and the non-volatile memory subsystem 40, between the power from the second power supply 80 and the power from the first power supply (e.g., system power) received via the interface 22. For example, the switch 90 may switch from the first power supply to the second power supply 80 when the voltage monitor 50 detects a low voltage condition. The switch 90 of certain embodiments advantageously ensures that the volatile memory elements 32 and non-volatile memory elements 42 are powered long enough for the data to be transferred from the volatile memory elements 32 and stored in the non-volatile memory elements 42. In certain embodiments, after the data transfer is complete, the switch 90 then switches back to the first power supply and the controller 62 transmits a signal to the at least one circuit 52 to operatively decouple the controller 62 from the volatile memory subsystem 30, such that the memory system 10 reenters the first state.

When the memory system 10 re-enters the first state, data may be transferred back from the non-volatile memory subsystem 40 to the volatile memory subsystem 30 via the controller 62. The host system can then resume accessing the volatile memory subsystem 30 of the memory module 10. In certain embodiments, after the memory system 10 enters or re-enters the first state (e.g., after power is restored), the host system accesses the volatile memory subsystem 30 rather than the non-volatile memory subsystem 40 because the volatile memory elements 32 have superior read/write characteristics. In certain embodiments, the transfer of data from the volatile memory bank 30 to the nonvolatile memory bank 40, or from the non-volatile memory bank 40 to the volatile memory bank 30, takes less than one minute per GB.

In certain embodiments, the memory system 10 protects the operation of the volatile memory when communicating with the host-system and provides backup and restore capability in the event of a trigger condition such as a power failure. In certain embodiments, the memory system 10 copies the entire contents of the volatile memory subsystem 30 into the non-volatile memory subsystem 40 on each backup operation. Moreover, in certain embodiments, the entire contents of the non-volatile memory subsystem 40 are copied back into the volatile memory subsystem 30 on each restore operation. In certain embodiments, the entire contents of the non-volatile memory subsystem 40 are accessed for each backup and/or restore operation, such that the non-volatile memory subsystem 40 (e.g., flash memory subsystem) is used generally uniformly across its memory space and wear-leveling is not performed by the memory system 10. In certain embodiments, avoiding wear-leveling can decrease cost and complexity of the memory system 10 and can improve the performance of the memory system 10. In certain other embodiments, the entire contents of the volatile memory subsystem 30 are not copied into the non-volatile memory subsystem 40 on each backup operation, but only a partial copy is performed. In certain embodiments, other management capabilities such as bad-block management and error management for the flash memory elements of the non-volatile memory subsystem 40 are performed in the controller 62.

The memory system 10 generally operates as a write-back cache in certain embodiments. For example, in one embodiment, the host system (e.g., a disk controller) writes data to the volatile memory subsystem 30 which then writes the data to non-volatile storage which is not part of the memory system 10, such as, for example, a hard disk. The disk controller may wait for an acknowledgment signal from the memory system 10 indicating that the data has been written to the hard disk or is otherwise secure. The memory system 10 of certain embodiments can decrease delays in the system operation by indicating that the data has been written to the hard disk before it has actually done so. In certain embodiments, the memory system 10 will still be able to recover the data efficiently in the event of a power outage because of the backup and restore capabilities described herein. In certain other embodiments, the memory system 10 may be operated as a write-through cache or as some other type of cache.

Figure 5:
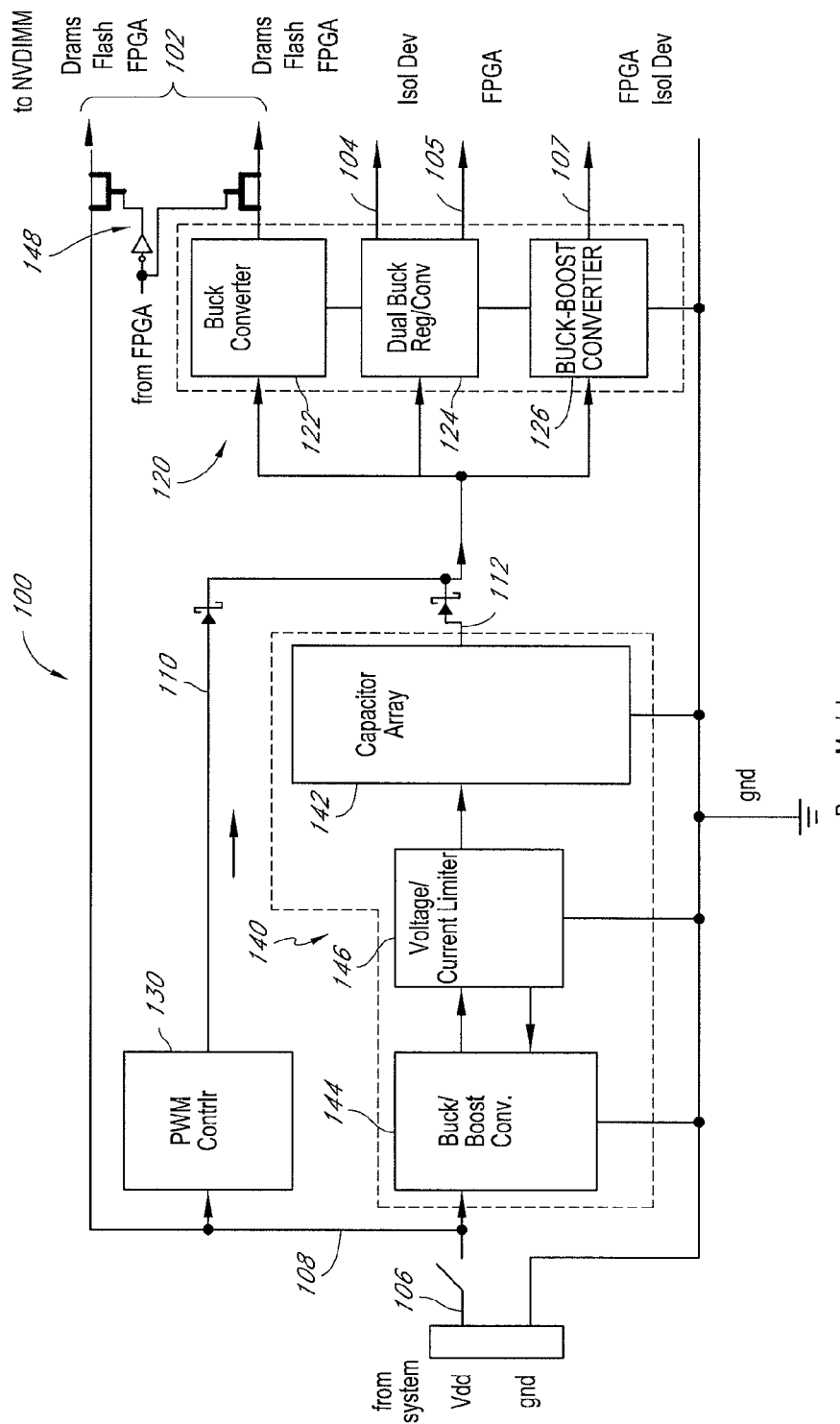
FIG. 5 schematically illustrates an example power module of a memory system in accordance with certain embodiments described herein.

FIG. 5 schematically illustrates an example power module 100 of the memory system 10 in accordance with certain embodiments described herein. The power module 100 provides power to the various components of the memory system 10 using different elements based on a state of the memory system 10 in relation to a trigger condition. In certain embodiments, the power module 100 comprises one or more of the components described above with respect to FIG. 1. For example, in certain embodiments, the power module 100 includes the second power supply 80 and the switch 90.

The power module 100 provides a plurality of voltages to the memory system 10 comprising non-volatile and volatile memory subsystems 30, 40. The plurality of voltages comprises at least a first voltage 102 and a second voltage 104. The power module 100 comprises an input 106 providing a third voltage 108 to the power module 100 and a voltage conversion element 120 configured to provide the second voltage 104 to the memory system 10. The power module 100 further comprises a first power element 130 configured to selectively provide a fourth voltage 110 to the conversion element 120. In certain embodiments, the first power element 130 comprises a pulse-width modulation power controller. For example, in one example embodiment, the first power element 130 is configured to receive a 1.8V input system voltage as the third voltage 108 and to output a modulated 5V output as the fourth voltage 110.

The power module 100 further comprises a second power element 140 can be configured to selectively provide a fifth voltage 112 to the conversion element 120. The power module 100 can be configured to selectively provide the first voltage 102 to the memory system 10 either from the conversion element 120 or from the input 106.

The power module 100 can be configured to be operated in at least three states in certain embodiments. In a first state, the first voltage 102 is provided to the memory system 10 from the input 106 and the fourth voltage 110 is provided to the conversion element 120 from the first power element 130. In a second state, the fourth voltage 110 is provided to the conversion element 120 from the first power element 130 and the first voltage 102 is provided to the memory system 10 from the conversion element 120. In the third state, the fifth voltage 112 is provided to the conversion element 120 from the second power element 140 and the first voltage 104 is provided to the memory system 10 from the conversion element 120.

In certain embodiments, the power module 100 transitions from the first state to the second state upon detecting that a trigger condition is likely to occur and transitions from the second state to the third state upon detecting that the trigger condition has occurred. For example, the power module 100 may transition to the second state when it detects that a power failure is about to occur and transitions to the third state when it detects that the power failure has occurred. In certain embodiments, providing the first voltage 102 in the second state from the first power element 130 rather than from the input 106 allows a smoother transition from the first state to the third state. For example, in certain embodiments, providing the first voltage 102 from the first power element 130 has capacitive and other smoothing effects. In addition, switching the point of power transition to be between the conversion element 120 and the first and second power elements 130, 140 (e.g., the sources of the pre-regulated fourth voltage 110 in the second state and the pre-regulated fifth voltage 112 in the third state) can smooth out potential voltage spikes.

In certain embodiments, the second power element 140 does not comprise a battery and may comprise one or more capacitors. For example, as schematically illustrated in FIG. 4, the second power element 140 comprises a capacitor array 142, a buck-boost converter 144 which adjusts the voltage for charging the capacitor array and a voltage/current limiter 146 which limits the charge current to the capacitor array 142 and stops charging the capacitor array 142 when it has reached a certain charge voltage. In one example embodiment, the capacitor array 142 comprises two 50 farad capacitors capable of holding a total charge of 4.6V. For example, in one example embodiment, the buck-boost converter 144 receives a 1.8V system voltage (first voltage 108) and boosts the voltage to 4.3V which is outputted to the voltage current limiter 146. The voltage/current limiter 146 limits the current going to the capacitor array 142 to 1 A and stops charging the array 142 when it is charged to 4.3V. Although described with respect to certain example embodiments, one of ordinary skill will recognize from the disclosure herein that the second power element 140 may include alternative embodiments. For example, different components and/or different value components may be used. For example, in other embodiments, a pure boost converter may be used instead of a buck-boost converter. In another embodiment, only one capacitor may be used instead of a capacitor array 142.

The conversion element 120 can comprise one or more buck converters and/or one or more buck-boost converters. The conversion element 120 may comprise a plurality of sub-blocks 122, 124, 126 as schematically illustrated by FIG. 4, which can provide more voltages in addition to the second voltage 104 to the memory system 10. The sub-blocks may comprise various converter circuits such as buck-converters, boost converters, and buck-boost converter circuits for providing various voltage values to the memory system 10. For example, in one embodiment, sub-block 122 comprises a buck converter, sub-block 124 comprises a dual buck converter, and sub-block 126 comprises a buck-boost converter as schematically illustrated by FIG. 4. Various other components for the sub-blocks 122, 124, 126 of the conversion element 120 are also compatible with certain embodiments described herein. In certain embodiments, the conversion element 120 receives as input either the fourth voltage 110 from the first power element 130 or the fifth voltage 112 from the second power element 140, depending on the state of the power module 100, and reduces the input to an appropriate amount for powering various components of the memory system. For example, the buck-converter of sub-block 122 can provide 1.8V at 2 A for about 60 seconds to the volatile memory elements 32 (e.g., DRAM), the non-volatile memory elements 42 (e.g., flash), and the controller 62 (e.g., an FPGA) in one embodiment. The sub-block 124 can provide the second voltage 104 as well as another reduced voltage 105 to the memory system 10. In one example embodiment, the second voltage 104 is 2.5V and is used to power the at least one circuit 52 (e.g., isolation device) and the other reduced voltage 105 is 1.2V and is used to power the controller 62 (e.g., FPGA). The sub-block 126 can provide yet another voltage 107 to the memory system 10. For example, the voltage 107 may be 3.3V and may be used to power both the controller 62 and the at least one circuit 52.

Although described with respect to certain example embodiments, one of ordinary skill will recognize from the disclosure herein that the conversion element 120 may include alternative embodiments. For example, there may be more or less sub-blocks which may comprise other types of converters (e.g., pure boost converters) or which may produce different voltage values. In one embodiment, the volatile memory elements 32 and nonvolatile memory elements 42 are powered using independent voltages and are not both powered using the first voltage 102.

Figure 6:
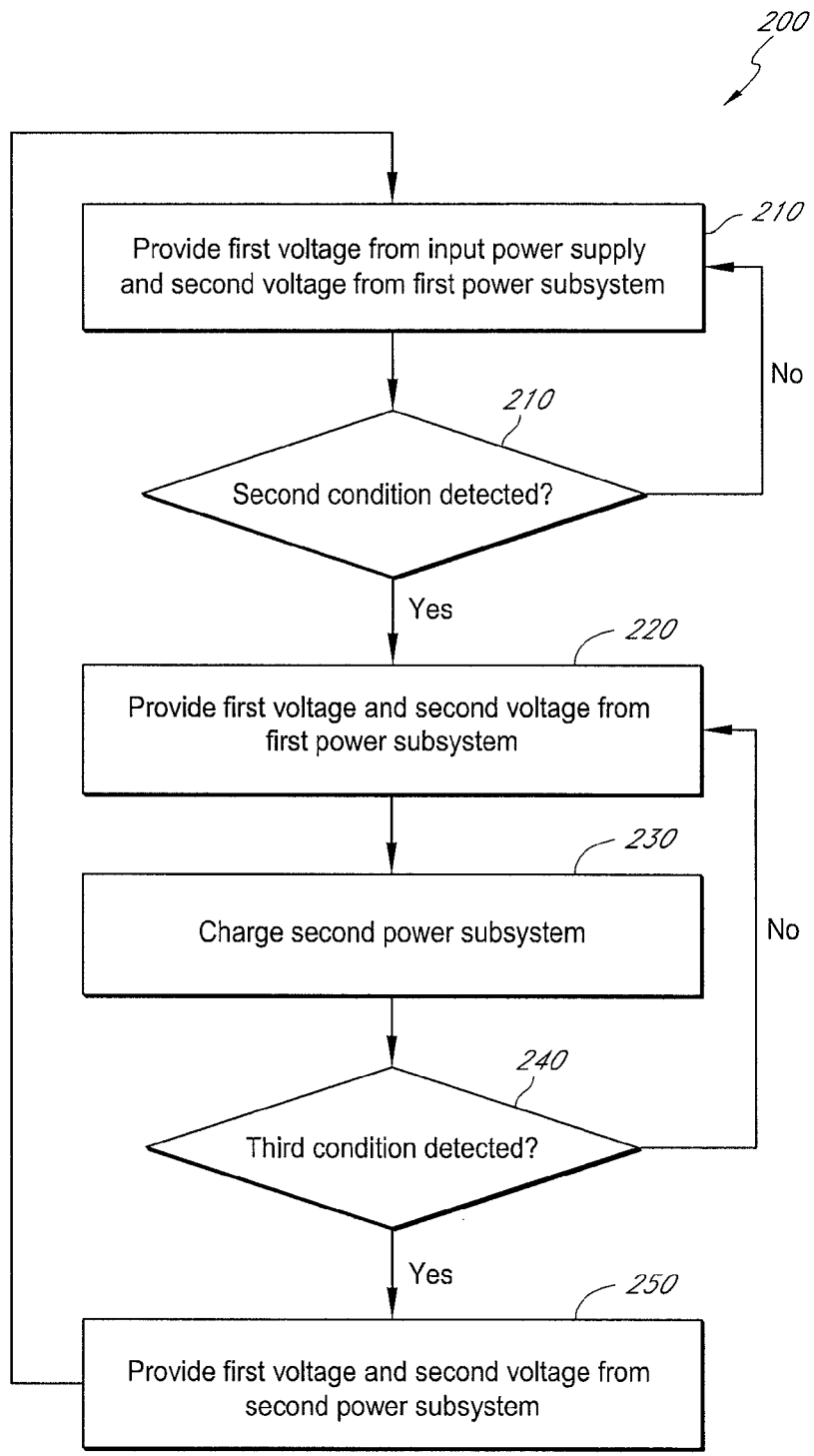
FIG. 6 is a flowchart of an example method of providing a first voltage and a second voltage to a memory system including volatile and non-volatile memory subsystems.

FIG. 6 is a flowchart of an example method 200 of providing a first voltage 102 and a second voltage 104 to a memory system 10 including volatile and nonvolatile memory subsystems 30, 40. While the method 200 is described herein by reference to the memory system 10 schematically illustrated by FIGS. 1-4, other memory systems are also compatible with embodiments of the method 200. During a first condition, the method 200 comprises providing the first voltage 102 to the memory system 10 from an input power supply 106 and providing the second voltage 104 to the memory system 10 from a first power subsystem in operational block 210. For example, in one embodiment, the first power subsystem comprises the first power element 130 and the voltage conversion element 120 described above with respect to FIG. 4. In other embodiments, other first power subsystems are used.

The method 200 further comprises detecting a second condition in operational block 220. In certain embodiments, detecting the second condition comprises detecting that a trigger condition is likely to occur. During the second condition, the method 200 comprises providing the first voltage 102 and the second voltage 104 to the memory system 10 from the first power subsystem in an operational block 230. For example, referring to FIG. 4, a switch 148 can be toggled to provide the first voltage 102 from the conversion element 120 rather than from the input power supply.

The method 200 further comprises charging a second power subsystem in operational block 240. In certain embodiments, the second power subsystem comprises the second power element 140 or another power supply that does not comprise a battery. For example, in one embodiment, the second power subsystem comprises the second power element 140 and the voltage conversion element 120 described above with respect to FIG. 4. In other embodiments, some other second power subsystem is used.

The method 200 further comprises detecting a third condition in an operational block 250 and during the third condition, providing the first voltage 102 and the second voltage 104 to the memory system 10 from the second power subsystem 140 in an operational block 250. In certain embodiments, detecting the third condition comprises detecting that the trigger condition has occurred. The trigger condition may comprise various conditions described herein. In various embodiments, for example, the trigger condition comprises a power reduction, power failure, or system hang-up. The operational blocks of the method 200 may be performed in different orders in various embodiments. For example, in certain embodiments, the second power subsystem 140 is charged before detecting the second condition.

In certain embodiments, the memory system 10 comprises a volatile memory subsystem 30 and a non-volatile memory subsystem 40 comprising at least 100 percent more storage capacity than does the volatile memory subsystem. The memory system 10 also comprises a controller 62 operatively coupled to the volatile memory subsystem 30 and operatively coupled to the non-volatile memory subsystem 40. The controller 62 can be configured to allow data to be communicated between the volatile memory subsystem 30 and the host system when the memory system 10 is operating in a first state and to allow data to be communicated between the volatile memory subsystem 30 and the non-volatile memory subsystem 40 when the memory system 10 is operating in a second state.

Although the memory system 10 having extra storage capacity of the non-volatile memory subsystem 40 has been described with respect to certain embodiments, alternative configurations exist. For example, in certain embodiments, there may be more than 100 percent more storage capacity in the non-volatile memory subsystem 40 than in the volatile memory subsystem 30. In various embodiments, there may be at least 200, 300, or 400 percent more storage capacity in the non-volatile memory subsystem 40 than in the volatile memory subsystem 30. In other embodiments, the non-volatile memory subsystem 40 includes at least some other integer multiples of the storage capacity of the volatile memory subsystem 30. In some embodiments, the non-volatile memory subsystem 40 includes a non-integer multiple of the storage capacity of the volatile memory subsystem 30. In one embodiment, the non-volatile memory subsystem 40 includes less than 100 percent more storage capacity than does the volatile memory subsystem 30.

The extra storage capacity of the non-volatile memory subsystem 40 can be used to improve the backup capability of the memory system 10. In certain embodiments in which data can only be written to portions of the non-volatile memory subsystem 40 which do not contain data (e.g., portions which have been erased), the extra storage capacity of the non-volatile memory subsystem 40 allows the volatile memory subsystem 30 to be backed up in the event of a subsequent power failure or other trigger event. For example, the extra storage capacity of the non-volatile memory subsystem 40 may allow the memory system 10 to backup the volatile memory subsystem 30 efficiently in the event of multiple trigger conditions (e.g., power failures). In the event of a first power failure, for example, the data in the volatile memory system 30 is copied to a first, previously erased portion of the nonvolatile memory subsystem 40 via the controller 62. Since the non-volatile memory subsystem 40 has more storage capacity than does the volatile memory subsystem 30, there is a second portion of the non-volatile memory subsystem 40 which does not have data from the volatile memory subsystem 30 copied to it and which remains free of data (e.g., erased). Once system power is restored, the controller 62 of the memory system 10 restores the data to the volatile memory subsystem 30 by copying the backed-up data from the non-volatile memory subsystem 40 back to the volatile memory subsystem 30. After the data is restored, the memory system 10 erases the non-volatile memory subsystem 40. While the first portion of the non-volatile memory subsystem 40 is being erased, it may be temporarily unaccessible.

If a subsequent power failure occurs before the first portion of the non-volatile memory subsystem 40 is completely erased, the volatile memory subsystem 30 can be backed-up or stored again in the second portion of the non-volatile memory subsystem 40 as described herein. In certain embodiments, the extra storage capacity of the non-volatile memory subsystem 40 may allow the memory system 10 to operate more efficiently. For example, because of the extra storage capacity of the non-volatile memory subsystem 40, the memory system 10 can handle a higher frequency of trigger events that is not limited by the erase time of the non-volatile memory subsystem 40.

Figure 7:
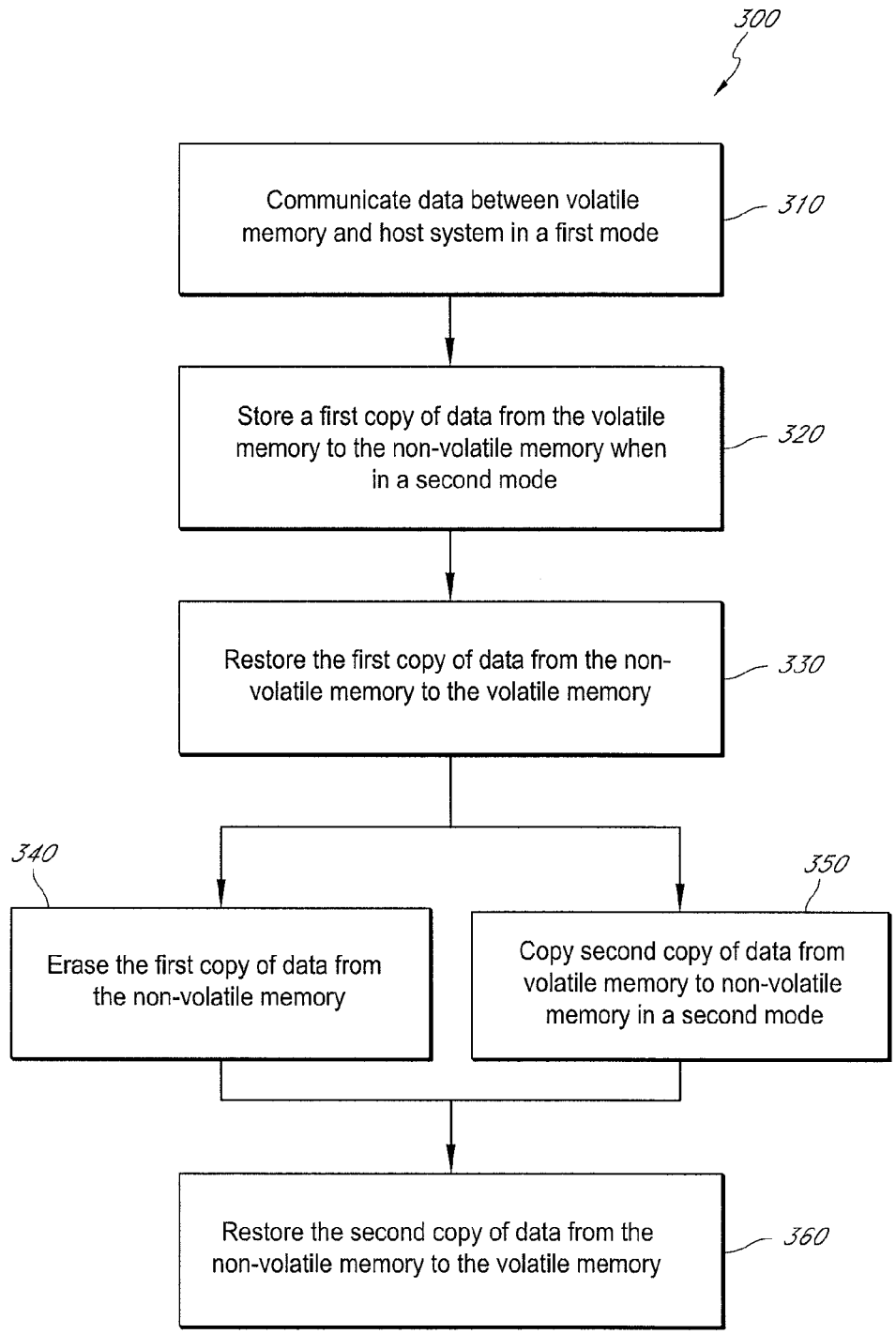
FIG. 7 is a flowchart of an example method of controlling a memory system operatively coupled to a host system and which includes at least 100 percent more storage capacity in non-volatile memory than in volatile memory.

FIG. 7 is a flowchart of an example method 300 of controlling a memory system 10 operatively coupled to a host system and which includes a volatile memory subsystem 30 and a non-volatile memory subsystem 40. In certain embodiments, the non-volatile memory subsystem 40 comprises at least 100 percent more storage capacity than does the volatile memory subsystem 30 as described herein. While the method 300 is described herein by reference to the memory system 10 schematically illustrated by FIGS. 1-3, the method 300 can be practiced using other memory systems in accordance with certain embodiments described herein. In an operational block 310, the method 300 comprises communicating data between the volatile memory subsystem 30 and the host system when the memory system 10 is in a first mode of operation. The method 300 further comprises storing a first copy of data from the volatile memory subsystem 30 to the non-volatile memory subsystem 40 at a first time when the memory system 10 is in a second mode of operation in an operational block 320.

In an operational block 330, the method 300 comprises restoring the first copy of data from the non-volatile memory subsystem 40 to the volatile memory subsystem 30. The method 300 further comprises erasing the first copy of data from the non-volatile memory subsystem 40 in an operational block 340. The method further comprises storing a second copy of data from the volatile memory subsystem 30 to the non-volatile memory subsystem 40 at a second time when the memory system 10 is in the second mode of operation in an operational block 350. Storing the second copy begins before the first copy is completely erased from the non-volatile memory subsystem 40.

In some embodiments, the memory system 10 enters the second mode of operation in response to a trigger condition, such as a power failure. In certain embodiments, the first copy of data and the second copy of data are stored in separate portions of the nonvolatile memory subsystem 40. The method 300 can also include restoring the second copy of data from the non-volatile memory subsystem 40 to the volatile memory subsystem 30 in an operational block 360. The operational blocks of method 300 referred to herein may be performed in different orders in various embodiments. For example, in some embodiments, the second copy of data is restored to the volatile memory subsystem 30 at operational block 360 before the first copy of data is completely erased in the operational block 340.

Figure 8:
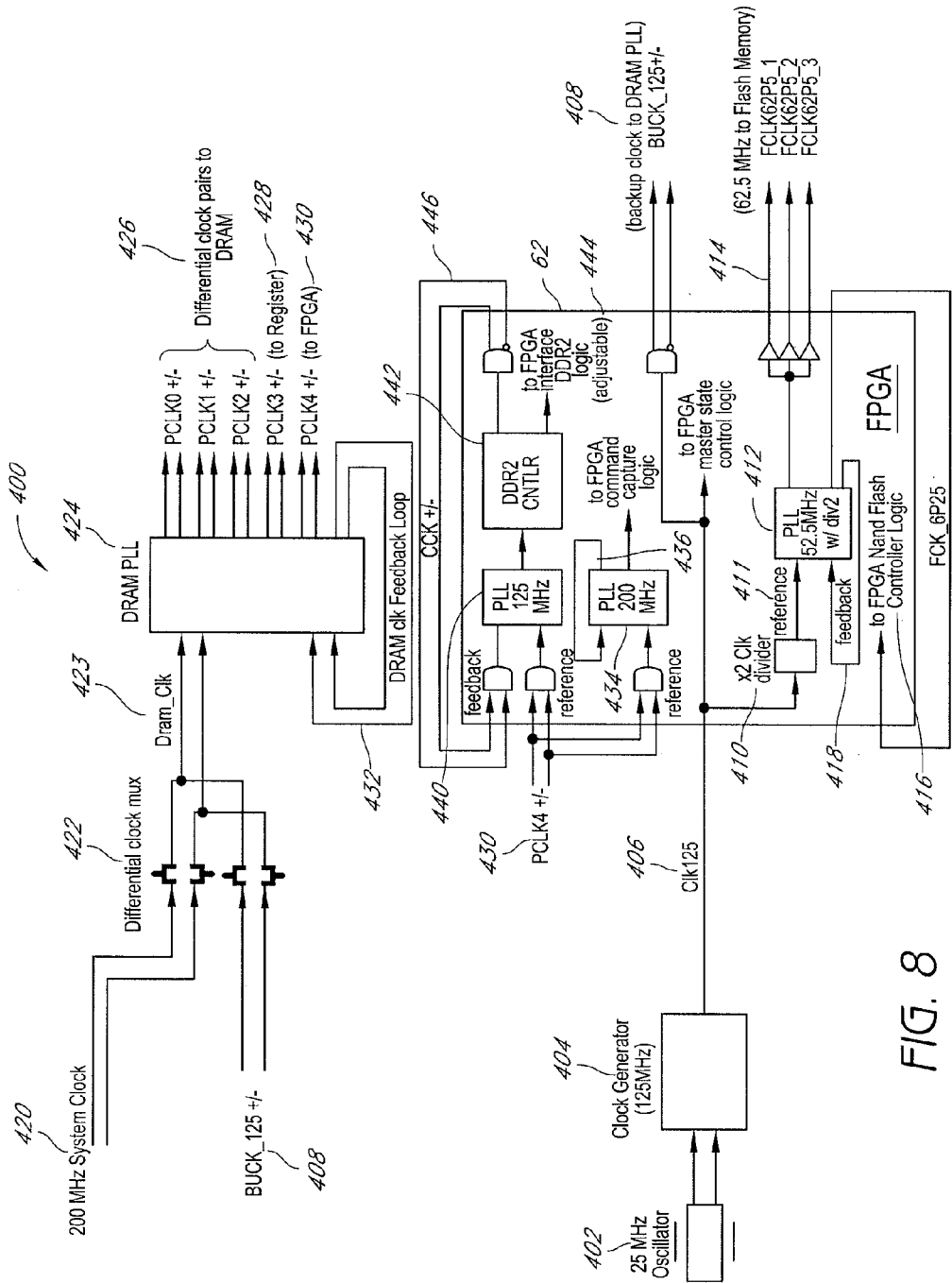
FIG. 8 schematically illustrates an example clock distribution topology of a memory system in accordance with certain embodiments described herein.

FIG. 8 schematically illustrates an example clock distribution topology 400 of a memory system 10 in accordance with certain embodiments described herein. The clock distribution topology 400 generally illustrates the creation and routing of the clock signals provided to the various components of the memory system 10. A clock source 402 such as, for example, a 25 MHz oscillator, generates a clock signal. The clock source 402 may feed a clock generator 404 which provides a clock signal 406 to the controller 62, which may be an FPGA. In one embodiment, the clock generator 404 generates a 125

MHz clock signal 406. The controller 62 receives the clock signal 406 and uses it to clock the controller 62 master state control logic. For example, the master state control logic may control the general operation of an FPGA controller 62.

The clock signal 406 can also be input into a clock divider 410 which produces a frequency-divided version of the clock signal 406. In an example embodiment, the clock divider 410 is a divide by two clock divider and produces a 62.5 MHz clock signal in response to the 125 MHz clock signal 406. A non-volatile memory phase-locked loop (PLL) block 412 can be included (e.g., in the controller 62) which distributes a series of clock signals to the non-volatile memory subsystem 40 and to associated control logic. For example, a series of clock signals 414 can be sent from the controller 62 to the non-volatile memory subsystem 40. Another clock signal 416 can be used by the controller logic which is dedicated to controlling the non-volatile memory subsystem 40. For example, the clock signal 416 may clock the portion of the controller 62 which is dedicated to generating address and/or control lines for the non-volatile memory subsystem 40. A feedback clock signal 418 is fed back into the non-volatile memory PLL block 412. In one embodiment, the PLL block 412 compares the feedback clock 418 to the reference clock 411 and varies the phase and frequency of its output until the reference 411 and feedback 418 clocks are phase and frequency matched.

A version of the clock signal 406 such as the backup clock signal 408 maybe sent from the controller to the volatile memory subsystem 30. The clock signal 408 may be, for example, a differential version of the clock signal 406. As described herein, the backup clock signal 408 may be used to clock the volatile memory subsystem 30 when the memory system 10 is backing up the data from the volatile memory subsystem 30 into the non-volatile memory subsystem 40. In certain embodiments, the backup clock signal 408 may also be used to clock the volatile memory subsystem 30 when the memory system 10 is copying the backed-up data back into the volatile memory subsystem 30 from the nonvolatile memory subsystem 40 (also referred to as restoring the volatile memory subsystem 30). The volatile memory subsystem 30 may normally be run at a higher frequency (e.g., DRAM running at 400 MHz) than the non-volatile memory subsystem 40 (e.g., flash memory running at 62.5 MHz) when communicating with the host system (e.g., when no trigger condition is present). However, in certain embodiments the volatile memory subsystem 30 may be operated at a reduced frequency (e.g., at twice the frequency of the non-volatile memory subsystem 40) without introducing significant delay into the system during backup operation and/or restore operations. Running the volatile memory subsystem 30 at the reduced frequency during a backup and/or restore operation may advantageously reduce overall power consumption of the memory system 10.

In one embodiment, the backup clock 408 and the volatile memory system clock signal 420 are received by a multiplexer 422, as schematically illustrated by FIG. 8. The multiplexer 422 can output either the volatile memory system clock signal 420 or the backup clock signal 408 depending on the backup state of the memory system 10. For example, when the memory system 10 is not performing a backup or restore operation and is communicating with the host system (e.g., normal operation), the volatile memory system clock signal 420 may be provided by the multiplexer 422 to the volatile memory PLL block 424. When the memory system 10 is performing a backup (or restore) operation, the backup clock signal 408 may be provided.

The volatile memory PLL block 424 receives the volatile memory reference clock signal 423 from the multiplexer 422 and can generate a series of clock signals which are distributed to the volatile memory subsystem 30 and associated control logic. For example, in one embodiment, the PLL block 424 generates a series of clock signals 426 which clock the volatile memory elements 32. A clock signal 428 may be used to clock control logic associated with the volatile memory elements, such as one or more registers (e.g., the one or more registers of a registered DIMM). Another clock signal 430 may be sent to the controller 62. A feedback clock signal 432 is fed back into the volatile memory PLL block 424. In one embodiment, the PLL block 424 compares the feedback clock signal 432 to the reference clock signal 423 and varies the phase and frequency of its output until the reference clock signal 423 and the feedback clock signal 432 clocks are phase and frequency matched.

The clock signal 430 may be used by the controller 62 to generate and distribute clock signals which will be used by controller logic which is configured to control the volatile memory subsystem 30. For example, control logic in the controller 62 may be used to control the volatile memory subsystem 30 during a backup or restore operation. The clock signal 430 may be used as a reference clock signal for the PLL block 434 which can generate one or more clocks 438 used by logic in the controller 62. For example, the PLL block 434 may generate one or more clock signals 438 used to drive logic circuitry associated with controlling the volatile memory subsystem 30. In certain embodiments, the PLL block 434 includes a feedback clock signal 436 and operates in a similar manner to other PLL blocks described herein.

The clock signal 430 may be used as a reference clock signal for the PLL block 440 which may generate one or more clock signals used by a sub-block 442 to generate one or more other clock signals 444. In one embodiment, for example, the volatile memory subsystem 30 comprises DDR2 SDRAM elements and the sub-block 442 generates one or more DDR2 compatible clock signals 444. A feedback clock signal 446 is fed back into the PLL block 440. In certain embodiments, the PLL block 440 operates in a similar manner to other PLL blocks described herein.

While described with respect to the example embodiment of FIG. 8, various alternative clock distribution topologies are possible. For example, one or more of the clock signals have a different frequency in various other embodiments. In some embodiments, one or more of the clocks shown as differential signals are single ended signals. In one embodiment, the volatile memory subsystem 30 operates on the volatile memory clock signal 420 and there is no backup clock signal 408. In some embodiments, the volatile memory subsystem 30 is operated at a reduced frequency during a backup operation and not during a restore operation. In other embodiments, the volatile memory subsystem 30 is operated at a reduced frequency during a restore operation and not during a backup operation.

Figure 9:
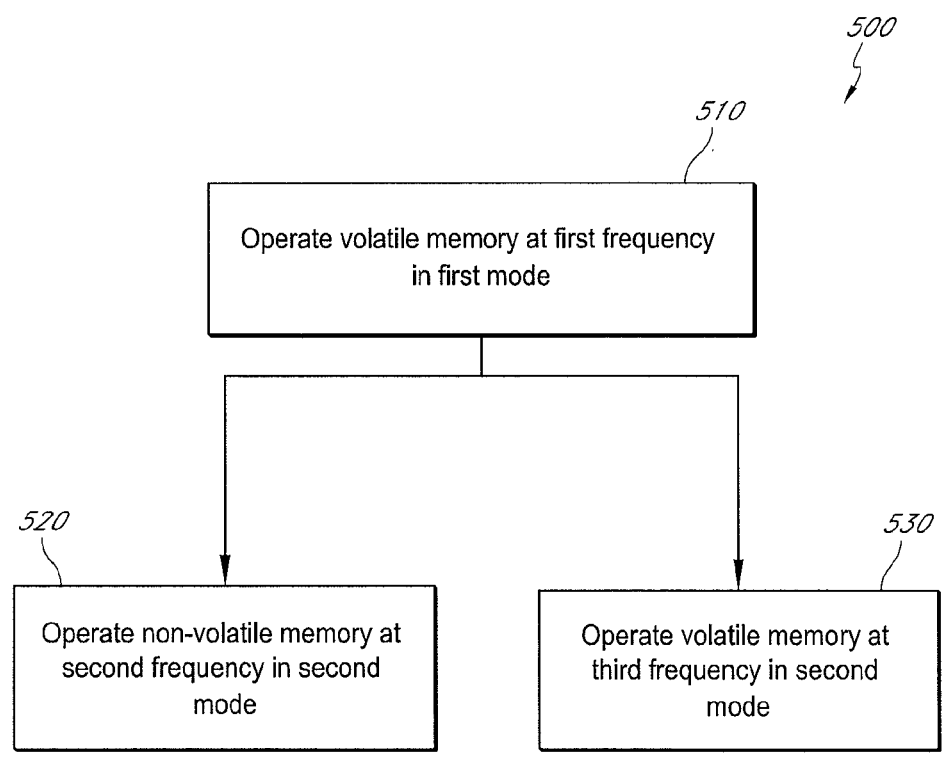
FIG. 9 is a flowchart of an example method of controlling a memory system operatively coupled to a host system, the method including operating a volatile memory subsystem at a reduced rate in a back-up mode.

FIG. 9 is a flowchart of an example method 500 of controlling a memory system 10 operatively coupled to a host system. Although described with respect to the memory system 10 described herein, the method 500 is compatible with other memory systems. The memory system 10 may include a clock distribution topology 400 similar to the one described above with respect to FIG. 8 or another clock distribution topology. The memory system 10 can include a volatile memory subsystem 30 and a non-volatile memory subsystem 40.

In an operational block 510, the method 500 comprises operating the volatile memory subsystem 30 at a first frequency when the memory system 10 is in a first mode of operation in which data is communicated between the volatile memory subsystem 30 and the host system. In an operational block 520, the method 500 comprises operating the non-volatile memory subsystem 40 at a second frequency when the memory system 10 is in a second mode of operation in which data is communicated between the volatile memory subsystem 30 and the non-volatile memory subsystem 40. The method 500 further comprises operating the volatile memory subsystem 30 at a third frequency in an operational block 530 when the memory system 10 is in the second mode of operation. In certain embodiments, the memory system 10 is not powered by a battery when it is in the second mode of operation. The memory system 10 may switch from the first mode of operation to the second mode of operation in response to a trigger condition. The trigger condition may be any trigger condition described herein such as, for example, a power failure condition. In certain embodiments, the second mode of operation includes both backup and restore operations as described herein. In other embodiments, the second mode of operation includes backup operations but not restore operations. In yet other embodiments, the second mode of operation includes restore operations but not backup operations.

The third frequency can be less than the first frequency. For example, the third frequency can be approximately equal to the second frequency. In certain embodiments, the reduced frequency operation is an optional mode. In yet other embodiments, the first, second and/or third frequencies are configurable by a user or by the memory system 10.

Figure 10:
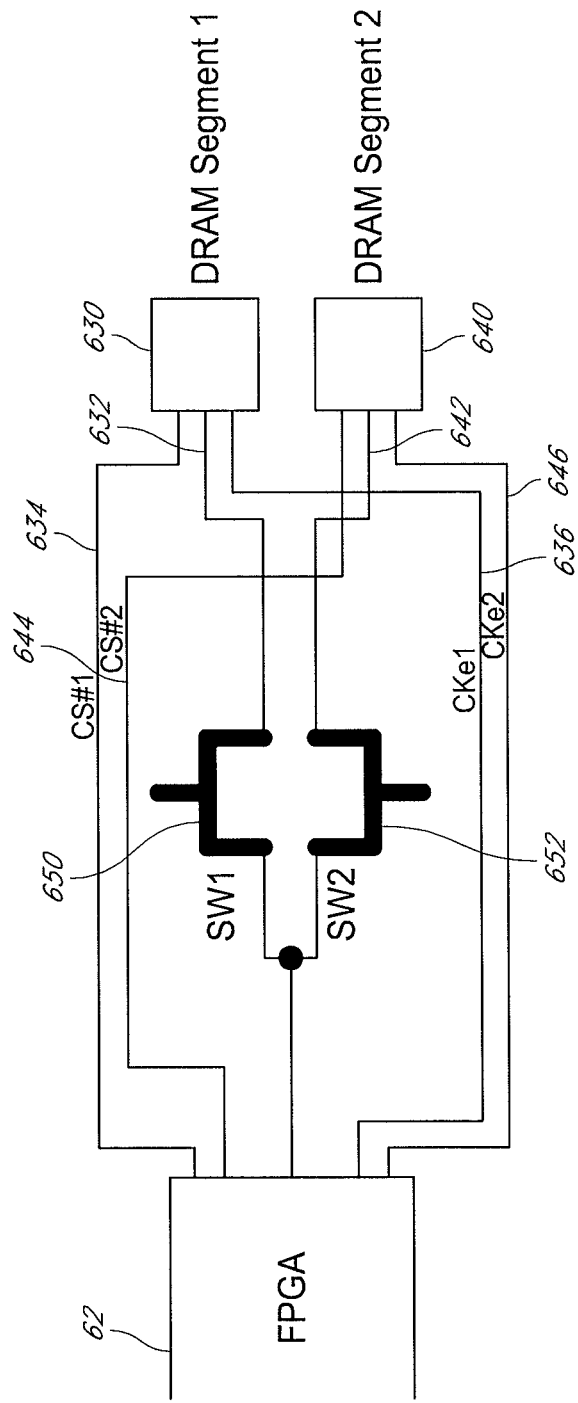
FIG. 10 schematically illustrates an example topology of a connection to transfer data slices from two DRAM segments of a volatile memory subsystem of a memory system to a controller of the memory system.

FIG. 10 schematically illustrates an example topology of a connection to transfer data slices from two DRAM segments 630, 640 of a volatile memory subsystem 30 of a memory system 10 to a controller 62 of the memory system 10. While the example of FIG. 10 shows a topology including two DRAM segments 630, 640 for the purposes of illustration, each address location of the volatile memory subsystem 30 comprises more than the two segments in certain embodiments. The data lines 632, 642 from the first DRAM segment 630 and the second DRAM segment 640 of the volatile memory subsystem 30 are coupled to switches 650, 652 which are coupled to the controller 62 (e.g., logic element 70) of the memory system 10. The chip select lines 634, 644 and the self-refresh lines 636, 646 (e.g., CKe signals) of the first and second DRAM segments 630, 640, respectively, are coupled to the controller 62. In certain embodiments, the controller 62 comprises a buffer (not shown) which is configured to store data from the volatile memory subsystem 30. In certain embodiments, the buffer is a first-in, first out buffer (FIFO). In certain embodiments, data slices from each DRAM segment 630, 640 comprise a portion of the volatile memory subsystem data bus. In one embodiment, for example, the volatile memory subsystem 30 comprises a 72-bit data bus (e.g., each data word at each addressable location is 72 bits wide and includes, for example, 64 bits of accessible SDRAM and 8 bits of ECC), the first data slice from the first DRAM segment 630 may comprise 40 bits of the data word, and the second data slice from the second DRAM segment 640 may comprise the remaining 32 bits of the data word. Certain other embodiments comprise data buses and/or data slices of different sizes.

In certain embodiments, the switches 650, 652 can each be selectively switched to selectively operatively couple the data lines 632, 642, respectively from the first and second DRAM segments 630, 640 to the controller 62. The chip select lines 634, 644 enable the first and second DRAM segments 630, 640, respectively, of the volatile memory subsystem 30, and the self-refresh lines 636, 646 toggle the first and second DRAM segments 630, 640, respectively, from self-refresh mode to active mode. In certain embodiments, the first and second DRAM segments 630, 640 maintain stored information but are not accessible when they are in self-refresh mode, and maintain stored information and are accessible when they are in active mode.

In certain embodiments, when the memory system 10 is backing up the volatile memory system 30, data slices from only one of the two DRAM segments 630, 640 at a time are sent to the controller 62. For example, when the first slice is being written to the controller 62 during a back-up, the controller 62 sends a signal via the CKe line 636 to the first DRAM segment 630 to put the first DRAM segment 630 in active mode. In certain embodiments, the data slice from the first DRAM segment 630 for multiple words (e.g., a block of words) is written to the controller 62 before writing the second data slice from the second DRAM segment 640 to the controller 62. While the first data slice is being written to the controller 62, the controller 62 also sends a signal via the CKe line 646 to put the second DRAM segment 640 in self-refresh mode. Once the first data slice for one word or for a block of words is written to the controller 62, the controller 62 puts the first DRAM segment 630 into self-refresh mode by sending a signal via the CKe line 636 to the first DRAM segment 640. The controller 62 also puts the second DRAM segment 640 into active mode by sending a signal via the CKe line 646 to the DRAM segment 640. The second slice for a word or for a block of words is written to the controller 62. In certain embodiments, when the first and second data slices are written to the buffer in the controller 62, the controller 62 combines the first and second data slices 630, 640 into complete words or blocks of words and then writes each complete word or block of words to the non-volatile memory subsystem 40. In certain embodiments, this process is called "slicing" the volatile memory subsystem 30.

In certain embodiments, the data may be sliced in a restore operation as well as, or instead of, during a backup operation. For example, in one embodiment, the nonvolatile memory elements 42 write each backed-up data word to the controller 62 which writes a first slice of the data word to the volatile memory subsystem 30 and then a second slice of the data word to the volatile memory subsystem 30. In certain embodiments, slicing the volatile memory subsystem 30 during a restore operation may be performed in a manner generally inverse to slicing the volatile memory subsystem 30 during a backup operation.

Figure 11:
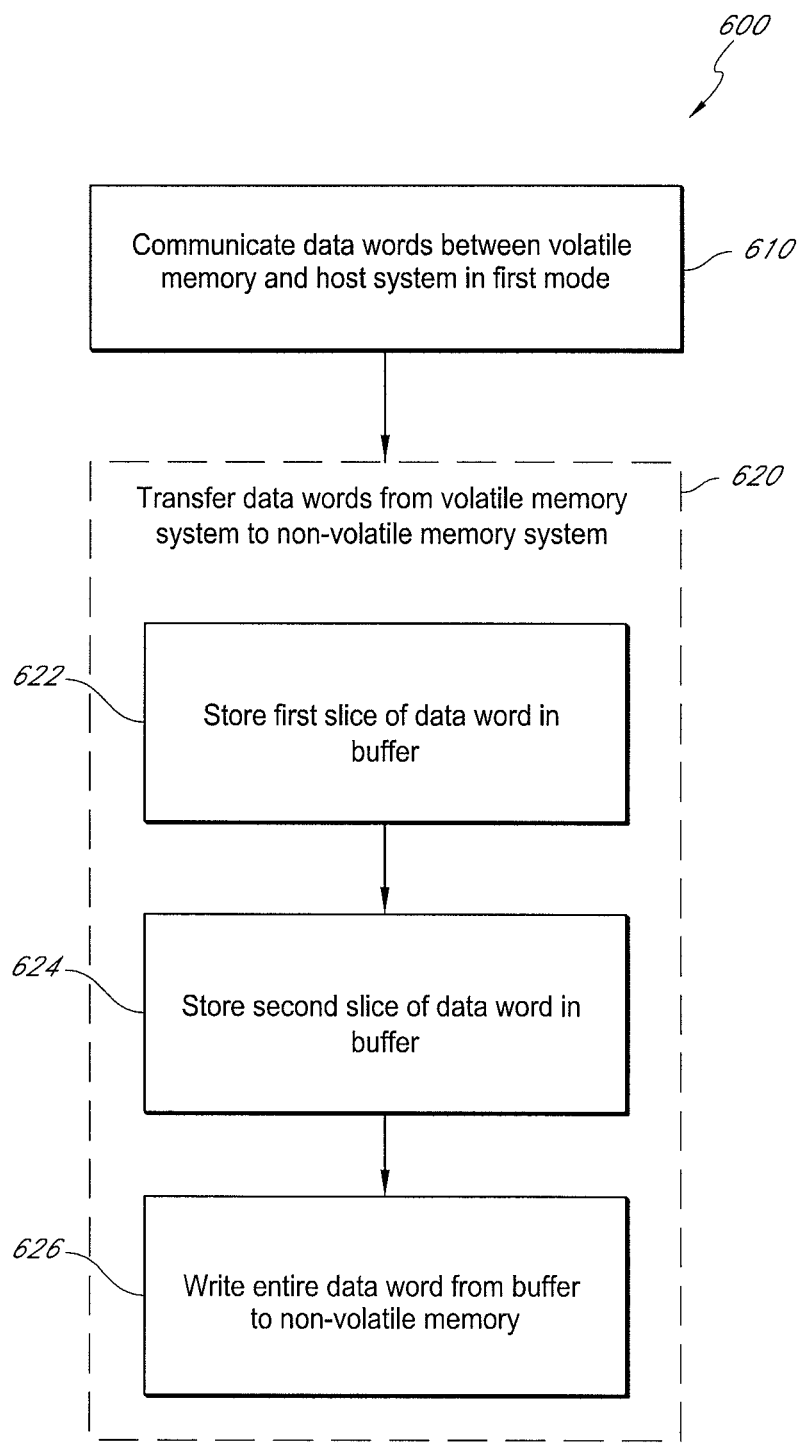
FIG. 11 is a flowchart of an example method of controlling a memory system operatively coupled to a host system, the method including backing up and/or restoring a volatile memory subsystem in slices.

FIG. 11 is a flowchart of an example method 600 of controlling a memory system 10 operatively coupled to a host system and which includes a volatile memory subsystem 30 and a non-volatile memory subsystem 40. Although described with respect to the memory system 10 described herein with respect to FIGS. 1-3 and 10, the method 600 is compatible with other memory systems. The method 600 comprises communicating data words between the volatile memory subsystem 30 and the host system when the memory system 10 is in a first mode of operation in an operational block 610. For example, the memory system 10 may be in the first mode of operation when no trigger condition has occurred and the memory system is not performing a backup and/or restore operation or is not being powered by a secondary power supply.

In an operational block 620, the method further comprises transferring data words from the volatile memory subsystem 30 to the non-volatile memory subsystem 40 when the memory system 10 is in a second mode of operation. In certain embodiments, each data word comprises the data stored in a particular address of the memory system 10. The memory system 10 may enter the second mode of operation, for example, when a trigger condition (e.g., a power failure) occurs. In certain embodiments, transferring each data word comprises storing a first portion (also referred to as a slice) of the data word in a buffer in an operational block 622, storing a second portion of the data word in the buffer in an operational block 624, and writing the entire data word from the buffer to the non-volatile memory subsystem 40 in an operational block 626.

In one example embodiment, the data word may be a 72 bit data word (e.g., 64 bits of accessible SDRAM and 8 bits of ECC), the first portion (or "slice") may comprise 40 bits of the data word, and the second portion (or "slice") may comprise the remaining 32 bits of the data word. In certain embodiments, the buffer is included in the controller 62. For example, in one embodiment, the buffer is a first-in, first-out buffer implemented in the controller 62 which comprises an FPGA. The method 600 may generally be referred to as "slicing" the volatile memory during a backup operation. In the example embodiment, the process of "slicing" the volatile memory during a backup includes bringing the 32-bit slice out of self refresh, reading a 32-bit block from the slice into the buffer, and putting the 32-bit slice back into self-refresh. The 40-bit slice is then brought out of self-refresh and a 40-bit block from the slice is read into a buffer. Each block may comprise a portion of multiple words. For example, each 32-bit block may comprise 32-bit portions of multiple 72-bit words. In other embodiments, each block comprises a portion of a single word. The 40-bit slice is then put back into self-refresh in the example embodiment. The 32-bit and 40-bit slices are then combined into a 72-bit block by the controller 62 and ECC detection/correction is performed on each 72-bit word as it is read from the buffer and written into the non-volatile memory subsystem (e.g., flash).

In some embodiments, the entire data word may comprise more than two portions. For example, the entire data word may comprise three portions instead of two and transferring each data word further comprises storing a third portion of each data word in the buffer. In certain other embodiments, the data word may comprise more than three portions.

In certain embodiments, the data may be sliced in a restore operation as well as, or instead of, during a backup operation. For example, in one embodiment, the nonvolatile memory elements 40 write each backed-up data word to the controller 62 which writes a first portion of the data word to the volatile memory subsystem 30 and then a second portion of the data word to the volatile memory 30. In certain embodiments, slicing the volatile memory subsystem 30 during a restore operation may be performed in a manner generally inverse to slicing the volatile memory subsystem 30 during a backup operation.

The method 600 can advantageously provide significant power savings and can lead to other advantages. For example, in one embodiment where the volatile memory subsystem 30 comprises DRAM elements, only the slice of the DRAM which is currently being accessed (e.g., written to the buffer) during a backup is configured in full-operational mode. The slice or slices that are not being accessed may be put in self-refresh mode. Because DRAM in self-refresh mode uses significantly less power than DRAM in full-operational mode, the method 600 can allow significant power savings. In certain embodiments, each slice of the DRAM includes a separate self-refresh enable (e.g., CKe) signal which allows each slice to be accessed independently.

In addition, the connection between the DRAM elements and the controller 62 may be as large as the largest slice instead of as large as the data bus. In the example embodiment, the connection between the controller 62 and the DRAM may be 40 bits instead of 72 bits. As a result, pins on the controller 62 may be used for other purposes or a smaller controller may be used due to the relatively low number of pin-outs used to connect to the volatile memory subsystem 30. In certain other embodiments, the full width of the data bus is connected between the volatile memory subsystem 30 and the controller 62 but only a portion of it is used during slicing operations. For example, in some embodiments, memory slicing is an optional mode.

Various embodiments of the present invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

The invention claimed is:

1. A method for transferring one or more data words from a volatile memory subsystem to a non-volatile memory subsystem, each of the one or more data words having a bitwidth equal to a bitwidth of the volatile memory subsystem and having a plurality of data word portions including a first data word portion and a second data word portion, the method comprising:
   in a first mode of operation, communicating data words between the volatile memory subsystem and a host system; and
   in a second mode of operation,
      transferring one or more first data word portions from the volatile memory subsystem into a buffer, each transferred first data word portion being smaller in bitwidth than the bitwidth of the entire data word;
      transferring one or more second data word portions from the volatile memory subsystem into the buffer, each transferred second data word portion being smaller in bitwidth than the bitwidth of the entire data word; and
      transferring data words from the buffer into the non-volatile memory subsystem an entire data word at a time or multiple data words in their entirety at a time.

2. The method of claim 1, wherein the plurality of first data word portions are stored in a first of two segments of the volatile memory subsystem and the plurality of second data word portions are stored in a second of the two segments of the volatile memory subsystem, and wherein, when data word portions of one of the two segments are being transferred into the buffer, the other of the two segments is inactivated.

3. The method of claim 2, wherein the inactivated segment conducts self-refresh.

4. The method of claim 1, wherein each of the one or more data words is 72 bits wide.

5. The method of claim 4, wherein each first data word portion is a 40-bit portion and each second data word portion is a 32-bit portion.

6. The method of claim 1, wherein the buffer is disposed in a memory module controller that includes the volatile memory subsystem and the non-volatile memory subsystem.

7. The method of claim 1, wherein each of the plurality of data words includes more than two of said portions.

8. The method of claim 7, wherein each of the more than two of said portions is stored in a corresponding segment of the volatile memory subsystem.

9. The method of claim 1, further comprising performing ECC detection/correction on each data word transferred from the buffer into the non-volatile memory subsystem.

10. A method for transferring one or more data words from a volatile memory subsystem to a non-volatile memory subsystem, each of the one or more data words having a bitwidth equal to a bitwidth of the volatile memory subsystem and having a plurality of data word portions including a first data word portion and a second data word portion, the method comprising:
transferring one or more first data word portions from the volatile memory subsystem into a buffer, each transferred first data word portion being smaller in bitwidth than the bitwidth of the entire data word;
transferring one or more second data word portions from the volatile memory subsystem into the buffer, each transferred second data word portion being smaller in bitwidth than the bitwidth of the entire data word; and
transferring data words from the buffer into the non-volatile memory subsystem an entire data word at a time or multiple data words in their entirety at a time.

11. The method of claim 10, wherein the plurality of first data word portions are stored in a first of two segments of the volatile memory subsystem and the plurality of second data word portions are stored in a second of two segments of the volatile memory subsystem, and wherein, when data word portions of one of the two segments are being transferred into the buffer, the other of the two segments is inactivated.

12. The method of claim 11, wherein the inactivated segment conducts self-refresh.

13. The method of claim 10, wherein each of the one or more data words is 72 bits wide.

14. The method of claim 13, wherein each first data word portion is a 40-bit portion and each second data word portion is a 32-bit portion.

15. The method of claim 10, wherein the buffer is disposed in a memory module controller that includes the volatile memory subsystem and the non-volatile memory subsystem.

16. The method of claim 10, wherein each of the plurality of data words includes more than two of said portions.

17. The method of claim 16, wherein each of the more than two of said portions is stored in a corresponding segment of the volatile memory subsystem.

18. The method of claim 10, further comprising performing ECC detection/correction on each data word transferred from the buffer into the non-volatile memory subsystem.

19. A memory system comprising:
a volatile memory subsystem having at least first and second segments and operable to store one or more data words each having a bitwidth equal to a bitwidth of the volatile memory subsystem such that a first portion of each data word with a bitwidth smaller than the bitwidth of the entire data word is stored in the first segment and a second portion of each data word with a bitwidth smaller than the bitwidth of the entire data word is stored in the second segment;
a non-volatile memory subsystem;
a buffer; and
a controller operable to:
in a first mode of operation of the memory system, communicate data words between the volatile memory subsystem and a host system; and
in a second mode of operation of the memory system, transfer one or more first portions of data words from the first segment into the buffer;
transfer one or more second portions of data words from the second segment into the buffer; and
transfer data words from the buffer into the non-volatile memory subsystem an entire data word at a time or multiple data words in their entirety at a time.

20. The system of claim 19, wherein during transfer of data word portions from one of the first or second segments into the buffer, the other of the first or second segments is configured to be inactivated.

21. The system of claim 20, wherein the inactivated segment is configured to self-refresh.

22. The system of claim 19, wherein each volatile memory subsystem is 72 bits wide.

23. The system of claim 22, wherein each first segment is 40 bits wide and each second segment is 32 bits wide.

24. The system of claim 19, wherein the buffer is disposed in the controller.

25. The system of claim 19, wherein the volatile memory subsystem has more than two segments.

26. A memory system comprising:
a volatile memory subsystem having at least first and second segments and operable to store one or more data words each having a bitwidth equal to a bitwidth of the volatile memory subsystem such that a first portion of each data word with a bitwidth smaller than the bitwidth of the entire data word is stored in the first segment and a second portion of each data word with a bitwidth smaller than the bitwidth of the entire data word is stored in the second segment;
a non-volatile memory subsystem;
a buffer; and
a controller operable to:
transfer one or more first portions of data words from the first segment into the buffer;
transfer one or more second portions of data words from the second segment into the buffer; and
transfer data words from the buffer into the non-volatile memory subsystem an entire data word at a time or multiple data words in their entirety at a time.

27. The system of claim 26, wherein during transfer of data word portions from one of the first or second segments into the buffer, the other of the first or second segments is configured to be inactivated.

28. The system of claim 27, wherein the inactivated segment is configured to self-refresh.

29. The system of claim 26, wherein each volatile memory subsystem is 72 bits wide.

30. The system of claim 29, wherein each first segment is 40 bits wide and each second segment is 32 bits wide.

31. The system of claim 26, wherein the buffer is disposed in the controller.

32. The system of claim 26, wherein the volatile memory subsystem has more than two segments.

* * * * *